(12) United States Patent
Jiang

(10) Patent No.: US 11,206,019 B2
(45) Date of Patent: Dec. 21, 2021

(54) CAPACITANCE DETECTION CIRCUIT, CAPACITANCE DETECTION METHOD, TOUCH CHIP, AND ELECTRONIC DEVICE

(71) Applicant: Shenzhen Goodix Technology Co., Ltd., Shenzhen (CN)

(72) Inventor: Hong Jiang, Shenzhen (CN)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/060,028

(22) Filed: Sep. 30, 2020

(65) Prior Publication Data

US 2021/0021265 A1 Jan. 21, 2021

Related U.S. Application Data

(63) Continuation of application No. PCT/CN2019/088819, filed on May 28, 2019.

(51) Int. Cl.
*H03K 17/96* (2006.01)
*G06F 3/041* (2006.01)
*G06F 3/044* (2006.01)

(52) U.S. Cl.
CPC ....... *H03K 17/9622* (2013.01); *G06F 3/0412* (2013.01); *G06F 3/0418* (2013.01);
(Continued)

(58) Field of Classification Search
CPC ....... H03K 17/9622; H03K 17/960725; H03K 2217/96074; G06F 3/0412; G06F 3/0446; G06F 3/0418; G06F 3/04166; G06F 3/044

See application file for complete search history.

(56) References Cited

U.S. PATENT DOCUMENTS

2005/0073324 A1* 4/2005 Umeda ............... G11C 27/026
324/662
2012/0182028 A1 7/2012 Oya
(Continued)

FOREIGN PATENT DOCUMENTS

CN 203084673 U 7/2013
CN 103941889 A 7/2014
(Continued)

OTHER PUBLICATIONS

Shenzhen Goodix Technology Co., Ltd., International Search Report, PCT/CN2019/088819, dated Feb. 21, 2020, 5 pgs.
(Continued)

*Primary Examiner* — Alexander Eisen
*Assistant Examiner* — Kebede T Teshome
(74) *Attorney, Agent, or Firm* — USCH Law, PC

(57) ABSTRACT

The present disclosure relates to the field of touch technologies, and in particular, to a capacitance detection circuit, a capacitance detection method, a touch chip, and an electronic device. The capacitance detection circuit includes: a control module, a charge transfer module, a processing module, a drive module, and a cancellation module. The control module is configured to control the drive module to charge a capacitor to be detected. The cancellation module is configured to perform M times of charge cancellations on the capacitor to be detected. The charge transfer module is configured to convert a charge of the capacitor to be detected, subject to the M times of charge cancellations, to generate an output voltage. The processing module is configured to determine, according to the output voltage, a capacitance variation of the capacitor to be detected.

18 Claims, 8 Drawing Sheets

(52) U.S. Cl.
   CPC . *G06F 3/0446* (2019.05); *H03K 2217/96074* (2013.01); *H03K 2217/960725* (2013.01)

(56) References Cited

U.S. PATENT DOCUMENTS

| | | | |
|---|---|---|---|
| 2018/0156853 A1* | 6/2018 | Kuang | G06F 3/04166 |
| 2019/0079609 A1* | 3/2019 | Jiang | G01R 27/2605 |
| 2019/0171312 A1* | 6/2019 | Chen | G06F 3/0416 |

FOREIGN PATENT DOCUMENTS

| | | |
|---|---|---|
| CN | 105468170 A | 4/2016 |
| CN | 107066122 A | 8/2017 |
| CN | 206877306 U | 1/2018 |
| CN | 107980115 A | 5/2018 |
| CN | 108475155 A | 8/2018 |
| EP | 3480607 A1 | 5/2019 |

OTHER PUBLICATIONS

International Search Report, PCT/CN2019/079550, dated Mar. 25, 2019, 5 pgs.
Shenzhen Goodix Technology Co., Ltd., Extended European Search Report, EP19920628.5, dated Apr. 8, 2021, 10 pgs.

* cited by examiner

CAPACITANCE DETECTION CIRCUIT, CAPACITANCE DETECTION METHOD, TOUCH CHIP, AND ELECTRONIC DEVICE

CROSS-REFERENCE TO RELATED APPLICATIONS

The present application is a continuation application of PCT Application No. PCT/CN2019/088819, filed May 28, 2019, entitled "CAPACITANCE DETECTION CIRCUIT, CAPACITANCE DETECTION METHOD, TOUCH CHIP, AND ELECTRONIC DEVICE," which is incorporated herein by reference in its entirety.

TECHNICAL FIELD

The present disclosure relates to the field of touch technologies, and in particular, to a capacitance detection circuit, a capacitance detection method, a touch chip, and an electronic device.

BACKGROUND

Self-capacitance detection is based on detecting a capacitance of a capacitor formed between a detection electrode and a system ground. When there is no external electric field caused by a finger or the like, the capacitor formed between the detection electrode and the system ground has a baseline capacitance or an initial capacitance. When a finger approaches or touches the detection electrode, a capacitance between the detection electrode and the system ground increases, and a related touch operation of a user may be determined by detecting capacitance variation of the capacitor.

In the field of capacitive touch, a flexible screen is an important development direction. When capacitive touch detection is implemented by using the self-capacitance principle, the detection electrode is closer to the system ground (that is, the distance between two electrode plates of the formed capacitor is smaller), because the flexible screen is usually thinner than a conventional capacitive touchscreen. Thus, the baseline capacitance of the capacitor is significantly higher than that of the conventional capacitive touchscreen. When there is a finger touch, the ratio of the variation of the self-capacitance to the baseline capacitance is obviously less than the ratio in the conventional capacitive touchscreen. Since the variation of the capacitance is small, a generated electrical signal is consequently small, such that the generated electrical signal is easily overwhelmed by circuit noise, and cannot be detected. According to the existing self-capacitance detection technology, the baseline capacitance needs to be canceled before self-capacitance detection. Due to a large baseline capacitance of a channel of the flexible screen, an on-going cancellation manner requires a huge capacitor, resulting in a large chip area. In addition, because the capacitive touch usually requires dozens or hundreds of channels, in addition to high costs, the on-going baseline capacitance cancellation method causes an excessively large chip size. As a result, it is not practical.

SUMMARY

In view of this, one of the technical problems to be solved by embodiments of the present disclosure is to provide a capacitance detection circuit, a touch chip, and an electronic device, to overcome the defects in the existing technology.

Some embodiments of the present disclosure provide a capacitance detection circuit, including: a control module, a charge transfer module, a processing module, a drive module, and a cancellation module. The control module is configured to control the drive module to charge a capacitor to be detected, the cancellation module is configured to perform M times of charge cancellations on the capacitor to be detected, the charge transfer module is configured to convert a charge of the capacitor to be detected, subject to the M times of charge cancellations, to generate an output voltage, and the processing module is configured to determine, according to the output voltage, a capacitance variation of the capacitor to be detected.

Some embodiments of the present disclosure provide a capacitance detection method, applied to a capacitance detection circuit and including: controlling a drive module to charge a capacitor to be detected, controlling a cancellation module to charge a cancellation capacitor and controlling the cancellation capacitor to perform M times of charge cancellations on the capacitor to be detected, controlling a charge transfer module to convert a charge of the capacitor to be detected, subject to the M times of charge cancellations, to generate an output voltage, and controlling a processing module to determine, according to the output voltage, a capacitance variation of the capacitor to be detected.

Some embodiments of the present disclosure provide a touch chip, including: the capacitance detection circuit according to any one of the embodiments of the present disclosure.

Some embodiments of the present disclosure provide an electronic device, including: the touch chip according to any one of the embodiments of the present disclosure.

In the technical solutions provided in certain embodiments of the present disclosure, the capacitance detection circuit includes: a control module, a charge transfer module, a processing module, a drive module, and a cancellation module. The control module is configured to control the drive module to charge a capacitor to be detected, the cancellation module is configured to charge a cancellation capacitor and perform M times of charge cancellations on the capacitor to be detected, the charge transfer module is configured to convert a charge of the capacitor to be detected, subject to the M times of charge cancellations, to generate an output voltage, and the processing module is configured to determine, according to the output voltage, a capacitance variation of the capacitor to be detected. When the capacitance detection circuit is applied to self-capacitance detection, cancellation efficiency of a cancellation circuit can be improved, and requirements on a capacitance of a cancellation capacitor can be lowered. Even a capacitance of a relatively small cancellation capacitor can cancel a baseline capacitance of a relatively large capacitor to be detected, costs are reduced, and noise of each cancellation voltage source is significantly reduced.

DETAILED DESCRIPTION

To make the objectives, technical solutions, and advantages of the present disclosure clearer, the following further describes some embodiments of the present disclosure in detail by using examples with reference to the accompanying drawings. However, a person of ordinary skill in the art may understand that in examples, to enable a reader to better understand the present disclosure, numerous technical details are provided. However, the technical solutions claimed in the present disclosure can still be practiced without the technical details or various changes and modifications based on the following embodiments.

Figure 1:
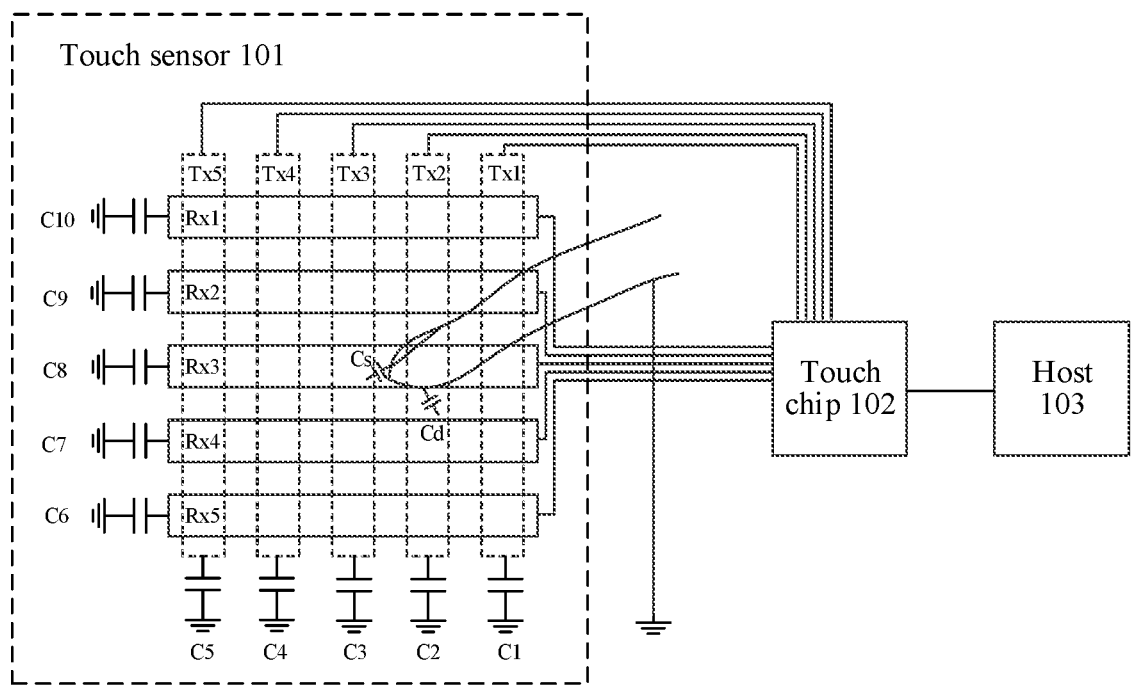
FIG. 1 is a schematic structural diagram of a capacitive touch system according to an embodiment of the present disclosure.

FIG. 1 is a schematic structural diagram of a capacitive touch system according to an embodiment of the present disclosure. As shown in FIG. 1, the capacitive touch system includes a touch sensor 101, a touch chip 102, and a host 103. The touch sensor 101 has a double-layer structure, and includes a drive channel Tx and a sensing channel Rx. In this embodiment, there are five drive channels and five sensing channels, and baseline capacitances of the five drive channels to a system ground and baseline capacitances of the five sensing channels to a system ground are respectively denoted as C1 to C5 and C6 to C10. When self-capacitance detection is performed, the touch chip 102 scans each channel, including a capacitance of each drive channel to the system ground and a capacitance of each sensing channel to the system ground, and calculates a capacitance variation of each channel to the system ground. When a finger approaches or touches a touchscreen, a capacitance of a channel, which is located at a region where the finger approaches or touches, to the system ground increases. As shown in FIG. 1, it is assumed that a capacitance between the finger and the drive channel Tx is Cd, and a capacitance between the finger and the sensing channel Rx is Cs. For example, when the finger approaches a drive channel Tx2 and a sensing channel Rx3, because a human body, as a conductor, is connected to the system ground, a capacitance of the drive channel Tx2 to the system ground becomes C2+Cd, and a capacitance of the sensing channel Rx3 to the system ground turns to C8+Cs. The touch chip 102 detects that the capacitances of the drive channel Tx2 to the system ground and the sensing channel Rx3 to the system ground both increase, while capacitances of other channels to the system ground do not change or almost do not change, or change less. Therefore, it may be obtained through calculation that a touch position is at an intersection between the drive channel Tx2 and the sensing channel Rx3, and coordinates of the position are sent to the host 103 to implement various functions of a touch operation. It should be noted that although the channels are respectively named a drive channel or a sensing channel in the present disclosure, a person skilled in the art may understand that in a self-capacitance detection mode, each of the drive channel and the sensing channel receives a drive signal outputted by the touch chip 102 and outputs a sensing signal. This is different from a mutual capacitance mode in which the drive channel only receives a drive signal and the sensing channel only outputs a sensing signal.

In an embodiment, a capacitance detection circuit is specifically configured on the touch chip 102 in FIG. 1, and therefore, it may be understood that the touch chip 102 includes the capacitance detection circuit described in the following embodiments.

Figure 2:
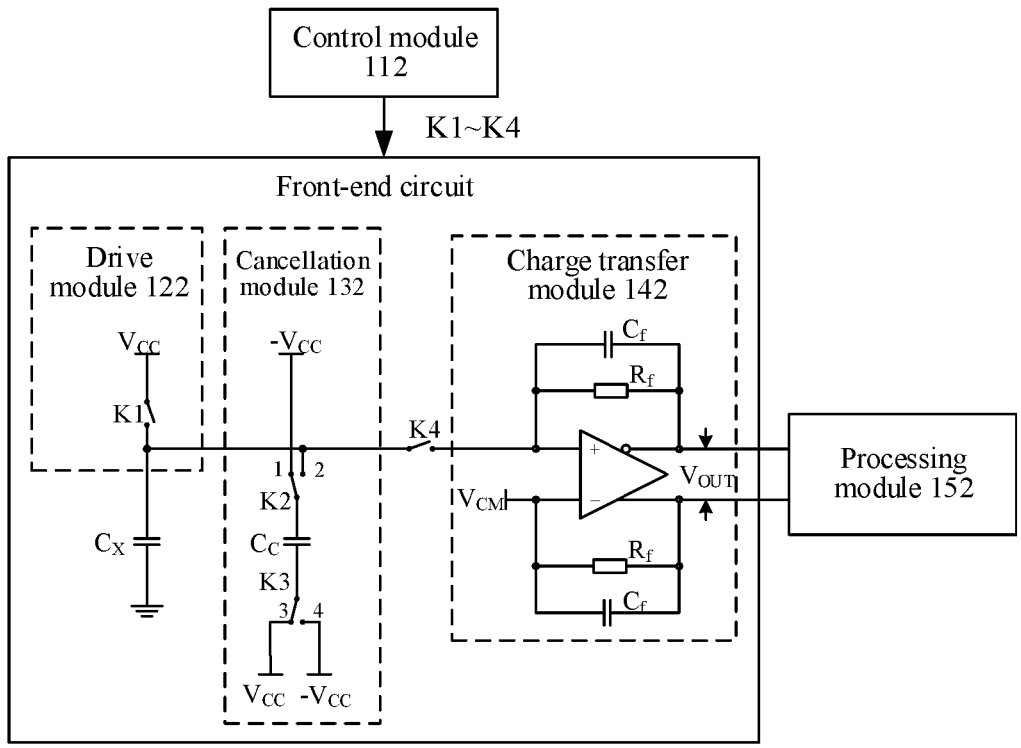
FIG. 2 is a schematic structural diagram of a capacitance detection circuit according to an embodiment of the present disclosure.

FIG. 2 is a schematic structural diagram of a capacitance detection circuit according to an embodiment of the present disclosure. As shown in FIG. 2, the capacitance detection circuit includes: a control module 112, a drive module 122, a cancellation module 132, a charge transfer module 142, and a processing module 152. The drive module 122, the cancellation module 132, and the charge transfer module 142 are specifically configured in a front-end circuit. The control module 112 is configured to control the drive module 122 to charge a capacitor to be detected. The cancellation module 132 is configured to perform M times of charge cancellations on the capacitor to be detected. The charge transfer module 142 is configured to convert a charge of the capacitor to be detected, subject to the charge cancellations, to generate an output voltage. The processing module 152 is configured to determine, according to the output voltage ($V_{out}$), a capacitance variation, due to an external electric field, of the capacitor to be detected.

As shown in FIG. 2, the drive module 122 includes a first switch unit K1 (for example, implemented by a single switch). The control module 112 is further configured to control the first switch unit K1 to be in a turned-on state, so that the drive module 122 charges a capacitor to be detected (hereinafter the capacitor $C_X$). Further, when the first switch unit K1 is in the turned-on state, the capacitor $C_X$ has a first end electrically connected to a first voltage ($V_{CC}$), and a second end electrically connected to a second voltage (GND), the first voltage being greater than the second voltage. In an embodiment, $V_{CC}$ is a positive supply voltage.

As shown in FIG. 2, the cancellation module 132 includes a second switch unit K2 (for example, implemented by a single switch) and a third switch unit K3 (for example, implemented by a single switch). The second switch unit K2 is connected to one end of a cancellation capacitor $C_C$, the third switch unit K3 is connected to the other end of the cancellation capacitor, and the second switch unit K2 and the third switch unit K3 may be in different turned-on states, so that the cancellation capacitor in the cancellation module implements the M times of charge cancellations on the capacitor to be detected.

Specifically, when the cancellation module 132 includes the second switch unit K2 and the third switch unit K3, the control module 112 controls the second switch unit and the third switch unit to switch between a first turned-on state and a second turned-on state back and forth for M times, so that the cancellation capacitor performs the charge cancellations on the capacitor to be detected. Specifically, when the cancellation module charges the cancellation capacitor, when the second switch unit K2 and the third switch unit K3 are in the first turned-on state, a first end of the cancellation capacitor $C_C$ is electrically connected to a third voltage ($-V_{CC}$) through the second switch unit K2, and a second end of the cancellation capacitor $C_C$ is electrically connected to a fourth voltage ($V_{CC}$) through the third switch unit K3, the fourth voltage being greater than the third voltage. Optionally, an absolute value of the fourth voltage may be equal to an absolute value of the third voltage.

Specifically, when the cancellation capacitor performs a charge cancellation on the capacitor to be detected, when the control module 112 controls the second switch unit K2 and the third switch unit K3 to be in the second turned-on state, the first end of the cancellation capacitor $C_C$ is electrically connected to the first end of the capacitor $C_X$, and the second end of the cancellation capacitor $C_C$ is electrically connected to a fifth voltage ($-V_{CC}$), the fifth voltage being less than the second voltage (GND) electrically connected to the second end of the capacitor $C_X$. In an embodiment, $-V_{CC}$ is a negative supply voltage. Further, when the cancellation capacitor performs a charge cancellation on the capacitor to be detected, the control module 112 controls the second switch unit K2 and the third switch unit K3 to switch between the first turned-on state and the second turned-on state back and forth for M times. Because a quantity of charges stored in the capacitor to be detected, after being charged, is different from a quantity of charges stored in the cancellation capacitor after being charged, and a capacitance value of the capacitor to be detected is much greater than a capacitance value of the cancellation capacitor, by controlling the circuit to switch from a charging state to a cancellation state, the cancellation capacitor may perform the M times of charge cancellations on the capacitor to be detected, to cancel the large baseline capacitance of a capacitor to be detected.

As shown in FIG. 2, a fourth switch unit K4 (for example, implemented by a single switch) is disposed between the charge transfer module 142 and the cancellation module 132. Correspondingly, the control module 112 further controls the fourth switch unit K4 to be in a turned-on state, so that the charge transfer module 142 is electrically connected to the capacitor $C_X$, to convert the charge of the capacitor $C_X$, subject to the charge cancellations, to generate the output voltage $V_{OUT}$.

In this embodiment, the charge transfer module 142 is specifically a fully differential amplifier. Further, a positive end of the fully differential amplifier may be electrically connected to the fourth switch unit K4, and a negative end of the fully differential amplifier is connected to a common-mode operating voltage $V_{CM}$. In the fully differential amplifier, a feedback resistor $R_f$ and a feedback capacitor $C_f$ are disposed between the positive end and one output end, and between the negative end and the other output end.

In this embodiment, the first switch unit K1 and the fourth switch unit K4 are single-pole single-throw switches. The second switch unit K2 and the third switch unit K3 are single-pole double-throw switches. For better describing switching of the switch units in a cancellation stage, a contact 1, a contact 2, a contact 3, and a contact 4 are configured. The contact 1 and the contact 3 are located in a charging branch, and may specifically include the contact 1 connected to $-V_{CC}$ and the contact 3 connected to $V_{CC}$.

Figure 3:
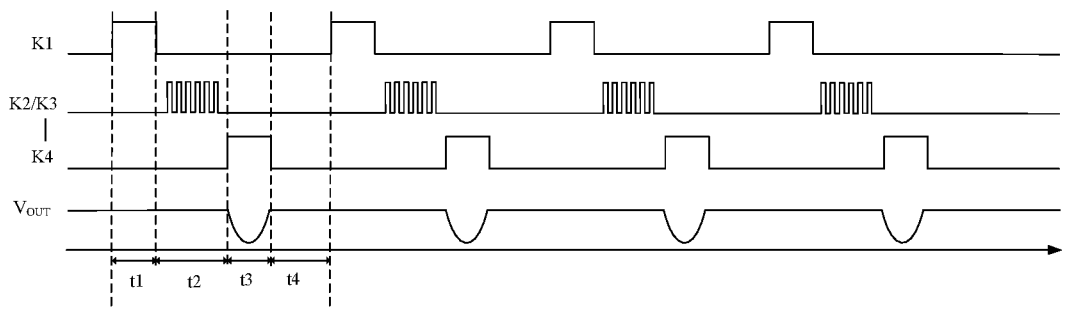
FIG. 3 is a timing diagram of the capacitance detection circuit in FIG. 2 according to an embodiment of the present disclosure.

FIG. 3 is a timing diagram of the capacitance detection circuit in FIG. 2 according to an embodiment of the present disclosure. In this embodiment of the present disclosure, a detection cycle includes periods of t1 to t4, and the detailed timing is as follows:

In the period t1, the first switch unit K1 is switched on (that is, K1 is in the turned-on state), the second switch unit K2 is connected to the contact 1 (that is, K2 is in the first turned-on state), the third switch unit K3 is connected to the contact 3 (that is, K3 is in the first turned-on state), the fourth switch unit K4 is switched off, and both the capacitor $C_X$ and the cancellation capacitor $C_C$ are charged. At the end of the period t1, the voltage of the capacitor $C_X$ is $V_{CC}$, the voltage of the cancellation capacitor $C_C$ is $-2V_{CC}$, and the output voltage $V_{OUT}$ of the charge transfer module is 0. In this case, the quantity of charges stored in the capacitor $C_X$ is $Q1=V_{CC}*C_X$, and the quantity of charges stored in the cancellation capacitor $C_C$ is $Q2=-2V_{CC}*C_C$.

In the period t2, the first switch unit K1 and the fourth switch unit K4 are switched off, the second switch unit K2 switches between the contact 1 (that is, being in the first turned-on state) and the contact 2 (that is, being in the second turned-on state) back and forth for M times, and the third switch unit K3 switches between the contact 3 (that is, being in the first turned-on state) and the contact 4 (that is, being in the second turned-on state) back and forth for M times. Each time the second switch unit K2 and the third switch unit K3 are switched from the first turned-on state to the second turned-on state, some of the charges stored in $C_X$ are canceled by the charges stored in $C_C$. After a steady state is achieved after repeating M times, according to the law of conservation of charge, $V_{CC}*C_X-2M*V_{CC}*C_C=V_X*C_X+M*(V_X+V_{CC})*C_C$ holds, and for the voltage of the capacitor $C_X$, $V_X=(V_{CC}*C_X-3M*V_{CC}*C_C)/(C_X+M*C_C)$ may be obtained.

In the period t3, the first switch unit K1 is switched off, the second switch unit K2 is connected to the contact 1 (that is, K2 is in the first turned-on state), the third switch unit K3 is connected to the contact 3 (that is, K3 is in the first turned-on state), and the fourth switch unit K4 is switched on. There are several cases as follows according to a value of the voltage $V_X$ of the capacitor $C_X$:

If $V_X>V_{CM}$, the capacitor $C_X$ and the cancellation capacitor $C_C$ both transfer a charge to the charge transfer module until the voltage of the capacitor $C_X$ reaches $V_{CM}$. In this process, the output voltage $V_{OUT}$ of the charge transfer module is a negative voltage.

If $V_X=V_{CM}$, the process of transferring the charge to the charge transfer module by the capacitor $C_X$ and the cancellation capacitor $C_C$ does not exist, and the output voltage $V_{OUT}$ of the charge transfer module is 0. In this case, the circuit reaches a complete cancellation state. By properly setting a parameter of the circuit, the circuit can reach the complete cancellation state when no touch occurs and can completely cancel a baseline capacitance of the capacitor $C_X$. When a touch occurs, a capacitance of the capacitor $C_X$ increases, and the output voltage $V_{OUT}$ is completely caused by the touch. Therefore, the detection sensitivity is the highest in this state.

If $V_X<V_{CM}$, the charge transfer module charges the capacitor $C_X$ and the cancellation capacitor $C_C$ through a feedback network including $R_f$ and $C_f$ until the voltages of $C_X$ and $C_C$ reach $V_{CM}$. In this process, the output voltage $V_{OUT}$ of the charge transfer module is a positive voltage.

In period t4, the first switch unit K1 is switched off, the second switch unit K2 and the third switch unit K3 are in the first turned-on state, the fourth switch unit K4 is switched off, the charge transfer module is reset, and the output voltage $V_{OUT}$ becomes 0.

It can be seen from the foregoing descriptions that, at the end of the period t2, $V_{CC}*C_X-2M*V_{CC}*C_C=V_X*C_X+M*(V_X+V_{CC})*C_C$.

It can be seen from the foregoing descriptions that, at the end of the period t3, the voltages of the capacitor $C_X$ and the cancellation capacitor $C_C$ are definitely $V_{CM}$, and the quantity of transferred charges is as follows:

$$\Delta Q = V_X * C_X + M*(V_X+V_{CC})*C_C - \\ (V_{CM}*C_X + M*(V_{CM}+V_{CC})*C_C) \\ = (V_{CC}-V_{CM})*C_X - M*(3V_{CC}+V_{CM})*C_C$$

According to the timing process of t1 to t4, the quantity of transferred charges may be $\Delta Q=(V_{CC}-V_{CM})*(C_{Xo}+\Delta C)-M*(3V_{CC}+V_{CM})*C_C$. When the complete cancellation state is reached, the quantity of transferred charges is $\Delta Q=(V_{CC}-V_{CM})\cdot\Delta C$, and an average value of the output voltage may be $V_{OUT}=2\Delta Q\cdot f\cdot R_f$. Here, f represents a detection frequency, a value of the detection frequency being a reciprocal of a detection cycle including t1 to t4.

In the complete cancellation state, $V_X=V_{CM}$, and the following relationship is obtained:

$$(V_{CC}-V_{CM})*C_{Xo}=M*(3V_{CC}+V_{CM})*C_C$$

The capacitance of the cancellation capacitor $C_C$ may be $C_C=C_{Xo}*(V_{CC}-V_{CM})/[M*(V_{CM}+3*V_{CC})]$. Particularly, when $V_{CC}=2V_{CM}$, the value of the capacitance of the cancellation capacitor $C_C$ may be $C_C=C_{Xo}/(7*M)$. The parameter of the cancellation capacitor $C_C$ is inversely proportional to the value of M, and a larger value of M indicates a smaller capacitance value of the cancellation capacitor. Parameters of the cancellation capacitor $C_C$ and M are properly set according to the value of the baseline capacitance $C_{Xo}$ of the capacitor $C_X$, so that the cancellation capacitor better implements a charge cancellation on the capacitor to be detected. For example, parameters of the cancellation capacitor $C_C$ and M are set according to the value of the baseline capacitance $C_{Xo}$ of the capacitor $C_X$ when the output voltage is 0, so that the circuit can reach the complete cancellation state when no touch occurs.

When M=20, $C_C=C_{Xo}/140$. The capacitance value of the cancellation capacitor $C_C$ may be greatly reduced, thereby reducing costs. In some embodiments of the present disclosure, M may be any value such as 5, 10, 20, or 50, and M may be set according to an actual requirement. The value of M is not limited in the present disclosure.

Figure 4:
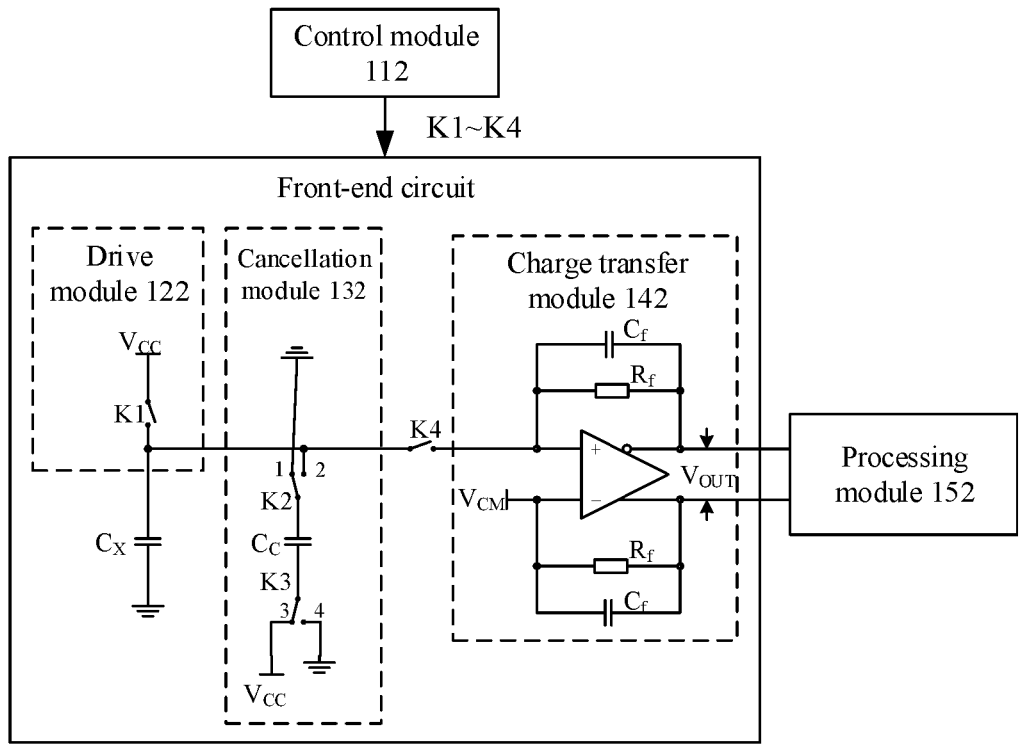
FIG. 4 is a schematic structural diagram of a capacitance detection circuit according to another embodiment of the present disclosure.

FIG. 4 is a schematic structural diagram of a capacitance detection circuit according to another embodiment of the present disclosure. As shown in FIG. 4, the capacitance detection circuit is approximately the same as that in the foregoing embodiment and includes: a control module 112, a drive module 122, a cancellation module 132, a charge transfer module 142, and a processing module 152. A difference from the foregoing embodiment is that, when the second switch unit K2 and the third switch unit K3 are in the second turned-on state, the first end of the cancellation capacitor $C_C$ is electrically connected to the first end of the capacitor $C_X$, and the second end of the cancellation capacitor $C_C$ is electrically connected to a sixth voltage (GND), the sixth voltage being equal to the second voltage (GND) electrically connected to the second end of the capacitor $C_X$. That is, the negative voltage $-V_{CC}$ in a charging branch and a cancellation branch in FIG. 2 is replaced with the system ground. The first switch unit K1 to the fourth switch unit K4 are disposed in a same manner and have the same on-off action control as that in the embodiment shown in FIG. 2.

Figure 5:
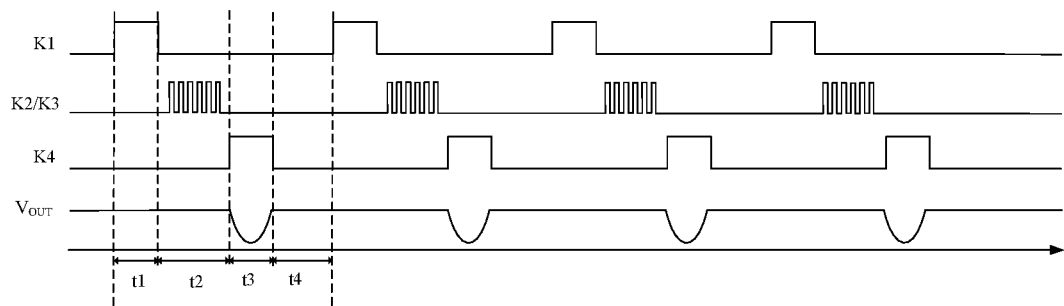
FIG. 5 is a timing diagram of the capacitance detection circuit in FIG. 4 according to an embodiment of the present disclosure.

FIG. 5 is a timing diagram of the capacitance detection circuit in FIG. 4 according to an embodiment of the present disclosure. In this embodiment of the present disclosure, a detection cycle still includes periods of t1 to t4, and the detailed timing is as follows:

In the period t1, the first switch unit K1 is switched on, the second switch unit K2 is connected to the contact 1, the third switch unit K3 is connected to the contact 3, the fourth switch unit K4 is switched off, and both the capacitor $C_X$ and the cancellation capacitor $C_C$ are charged. At the end of the period t1, the voltage of the capacitor $C_X$ is $V_{CC}$, the voltage of the cancellation capacitor $C_C$ is $-V_{CC}$, and the output voltage $V_{OUT}$ of the charge transfer module is 0. In this case, the quantity of charges stored in the capacitor $C_X$ is $Q1=V_{CC}*C_X$, and the quantity of charges stored in the cancellation capacitor $C_C$ is $Q2=-V_{CC}*C_C$.

In the period t2, the first switch unit K1 and the fourth switch unit K4 are switched off, and the second switch unit K2 and the third switch unit K3 simultaneously switch between the first turned-on state and the second turned-on state back and forth for M times. Each time the second switch unit K2 is switched from the contact 1 to the contact 2 and the third switch unit K3 is switched from the contact 3 to the contact 4, some of the charges stored in $C_X$ are canceled by the charges stored in $C_C$. After a steady state is achieved after repeating M times, according to the law of conservation of charge, $V_{CC}*C_X-M*V_{CC}*C_C=V_X*C_X+M*V_X*C_C$ holds, and for the voltage of the capacitor $C_X$, $V_X=V_{CC}*(C_X-M*C_C)/(C_X+M*C_C)$ may be obtained.

In the period t3, the first switch unit K1 is switched off, the second switch unit K2 and the third switch unit K3 are in the first turned-on state, and the fourth switch unit K4 is switched on. There are several cases as follows according to a value of the voltage $V_X$:

If $V_X>V_{CM}$, the capacitor $C_X$ and the cancellation capacitor $C_C$ both transfer a charge to the charge transfer module until the voltage of the capacitor $C_X$ reaches $V_{CM}$. In this process, the output voltage $V_{OUT}$ of the charge transfer module is a negative voltage.

If $V_X=V_{CM}$, the process of transferring the charge to the charge transfer module by the capacitor $C_X$ and the cancellation capacitor $C_C$ does not exist, and the output voltage $V_{OUT}$ of the charge transfer module is 0. In this case, the circuit reaches a complete cancellation state. By properly setting a parameter of the circuit, the circuit can reach the complete cancellation state when no touch occurs and can completely cancel a baseline capacitance of the capacitor $C_X$. When a touch occurs, a capacitance of the capacitor $C_X$ increases, and the output voltage $V_{OUT}$ is completely caused by the touch. Therefore, the detection sensitivity is the highest in this state.

If $V_X<V_{CM}$, the charge transfer module charges the capacitor $C_X$ and the cancellation capacitor $C_C$ through a feedback network including $R_f$ and $C_f$ until the voltages of $C_X$ and $C_C$ reach $V_{CM}$. In this process, the output voltage $V_{out}$ of the charge transfer module is a positive voltage.

In the period t4, the fourth switch unit K4 is switched off, the charge transfer module is reset, and the output voltage $V_{OUT}$ becomes 0.

According to the timing process of t1 to t4, the quantity of transferred charges may be $\Delta Q=(V_{CC}-V_{CM})(C_{Xo}+\Delta C)-M*(V_{CM}+V_{CC})*C_C$. When the complete cancellation state is reached, the quantity of transferred charges is $\Delta Q=(V_{CC}-V_{CM})\cdot \Delta C$. In the complete cancellation state, $V_X=V_{CM}$, and the following relationship is obtained:

$$(V_{CC}-V_{CM})C_{Xo}=M*(V_{CM}V_{CC})*C_C$$

$C_C=C_{Xo}*(V_{CC}-V_{CM})/[M*(V_{CM}+V_{CC})]$. Particularly, when $V_{CC}=2V_{CM}$, the value of the capacitance of the cancellation capacitor $C_C$ may be $C_C=C_{Xo}/(3*M)$. Parameters of the cancellation capacitor $C_C$ and M are properly set according to the value of the baseline capacitance $C_{Xo}$ of the capacitor $C_X$, so that the cancellation capacitor better implements a charge cancellation on the capacitor. By properly setting parameters of the circuit, the circuit can reach the complete cancellation state when no touch occurs.

When M=20, $C_C=C_{Xo}/60$. The capacitance value of the cancellation capacitor $C_C$ may be greatly reduced, thereby reducing costs. In some embodiment of the present disclosure, M may be any value such as 5, 10, 20, or 50, and M may be set according to an actual requirement. The value of M is not limited in the present disclosure.

Figure 6:
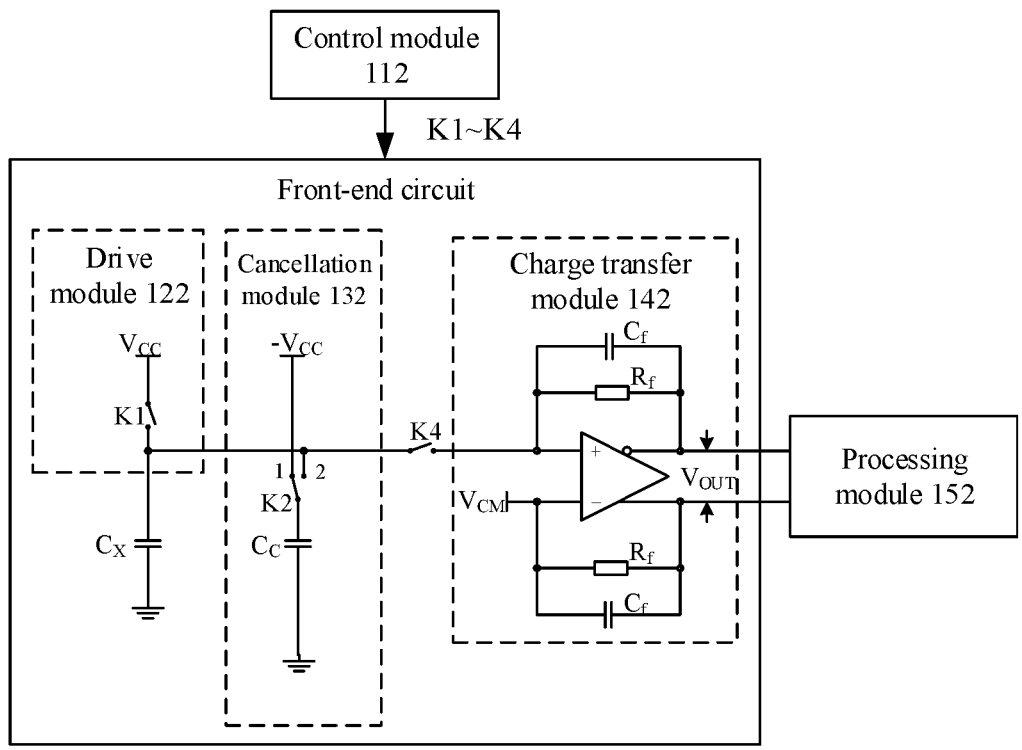
FIG. 6 is a schematic structural diagram of a capacitance detection circuit according to a further embodiment of the present disclosure.

FIG. 6 is a schematic structural diagram of a capacitance detection circuit according to an embodiment of the present disclosure. As shown in FIG. 6, the capacitance detection circuit is approximately the same as that in the foregoing embodiment and includes: a control module 112, a drive module 122, a cancellation module 132, a charge transfer module 142, and a processing module 152. A difference from the foregoing embodiment is that the cancellation module 132 includes the second switch unit K2 (but does not include the third switch unit K3), and the control module 112 is further configured to control the second switch unit K2 to be in a first turned-on state to form a charging branch, so that the drive module 122 charges the cancellation capacitor $C_C$. When the second switch unit K2 is in the first turned-on state, the first end of the cancellation capacitor $C_C$ is electrically connected to a seventh voltage ($-V_{CC}$) through the second switch unit K2, and the second end of the cancellation capacitor $C_C$ is electrically connected to an eighth voltage (GND), the seventh voltage being less than the eighth voltage.

Further, in this embodiment, the control module 112 controls the second switch unit K2 to switch between the first turned-on state and a second turned-on state back and forth for M times, so that the cancellation capacitor $C_C$ performs charge cancellations on the capacitor $C_X$. When the second switch unit K2 is in the second turned-on state, the first end of the cancellation capacitor $C_C$ is electrically connected to the first end of the capacitor $C_X$, and the second end of the cancellation capacitor $C_C$ is electrically connected to an eighth voltage (GND), the eighth voltage being equal to the second voltage (GND) electrically connected to the second end of the capacitor $C_X$.

Figure 7:
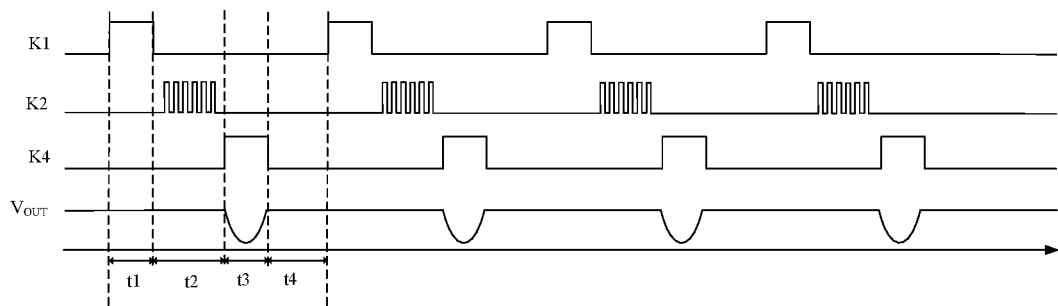
FIG. 7 is a timing diagram of the capacitance detection circuit in FIG. 6 according to an embodiment of the present disclosure.

FIG. 7 is a timing diagram of the capacitance detection circuit in FIG. 6 according to an embodiment of the present disclosure. In this embodiment of the present disclosure, a detection cycle still includes periods of t1 to t4, and the detailed timing is as follows:

In the period t1, the first switch unit K1 is switched on, the second switch unit K2 is connected to the contact 1, the fourth switch unit K4 is switched off, and both the capacitor $C_X$ and the cancellation capacitor $C_C$ are charged. At the end of the period t1, the voltage of the capacitor $C_X$ is $V_{CC}$, the voltage of the cancellation capacitor $C_C$ is $-V_{CC}$, and the output voltage $V_{OUT}$ of the charge transfer module is 0. In this case, the quantity of charges stored in the capacitor $C_X$ is $Q1=V_{CC}*C_X$, and the quantity of charges stored in the cancellation capacitor $C_C$ is $Q2=-V_{CC}*C_C$.

In the period t2, the first switch unit K1 and the fourth switch unit K4 are switched off, and the second switch unit K2 switches between the contact 1 and the contact 2 back and forth for M times. Each time the second switch unit K2 is switched from the contact 1 to the contact 2, some of the charges stored in $C_X$ are canceled by the charges stored in $C_C$. After a steady state is achieved after repeating M times, according to the law of conservation of charge, $V_{CC}*C_X-M*V_{CC}*C_C=V_X*C_X+M*V_X*C_C$ holds, and for the voltage of the capacitor $C_X$, $V_X=V_{CC}*(C_X-M*C_C)/(C_X+M*C_C)$ may be obtained.

In the period t3, the first switch unit K1 is switched off, the second switch unit K2 is connected to the contact 1 (that is, K2 is in the first turned-on state), and the fourth switch unit K4 is switched on. There are several cases as follows according to a value of the voltage $V_X$:

If $V_X>V_{CM}$, the capacitor $C_X$ and the cancellation capacitor $C_C$ both transfer a charge to the charge transfer module until the voltage of the capacitor $C_X$ reaches $V_{CM}$. In this process, the output voltage $V_{OUT}$ of the charge transfer module is a negative voltage.

If $V_X=V_{CM}$, the process of transferring the charge to the charge transfer module by the capacitor $C_X$ and the cancellation capacitor $C_C$ does not exist, and the output voltage $V_{OUT}$ of the charge transfer module is 0. In this case, the circuit reaches a complete cancellation state. By properly setting a parameter of the circuit, the circuit can reach the complete cancellation state when no touch occurs and can completely cancel a baseline capacitance of the capacitor $C_X$. When a touch occurs, a capacitance of the capacitor $C_X$ increases, and the output voltage $V_{OUT}$ is completely caused by the touch. Therefore, the detection sensitivity is the highest in this state.

If $V_X<V_{CM}$, the charge transfer module charges the capacitor $C_X$ and the cancellation capacitor $C_C$ through a feedback network including $R_f$ and $C_f$ until the voltages of $C_X$ and $C_C$ reach $V_{CM}$. In this process, the output voltage Vout of the charge transfer module is a positive voltage.

In the period t4, the fourth switch unit K4 is switched off, the charge transfer module is reset, and the output voltage $V_{OUT}$ becomes 0.

It can be seen from the foregoing descriptions that, at the end of the period t2: $V_{CC}*C_X-M*V_{CC}*C_C=V_X*C_X+M*V_X*C_C$.

It can be seen from the foregoing descriptions that, at the end of the period t3, the voltages of the capacitor $C_X$ and the cancellation capacitor $C_C$ are definitely $V_{CM}$, and the quantity of transferred charges is as follows:

$$\begin{aligned}\Delta Q &= V_X*C_X+M*V_X*C_C - \\ &\quad (V_{CM}*C_X+M*V_{CM}*C_C) \\ &= (V_{CC}-V_{CM})*C_X - M*(V_{CC}+V_{CM})*C_C\end{aligned}$$

According to the timing process of t1 to t4, the quantity of transferred charges may be $\Delta Q=(V_{CC}-V_{CM})*(C_{Xo}+\Delta C)-M*(V_{CC}+V_{CM})*C_C$. When the complete cancellation state is reached, the quantity of transferred charges is $\Delta Q=(V_{CC}-V_{CM})\cdot \Delta C$. In the complete cancellation state, the following relationship is obtained:

$$(V_{CC}-V_{CM})*C_{Xo}=M*(V_{CC}+V_{CM})*C_C$$

The capacitance of the cancellation capacitor $C_C$ may be $C_C=C_{Xo}*(V_{CC}-V_{CM})/[M*(V_{CM}+V_{CC})]$. Particularly, when $V_{CC}=2V_{CM}$, the value of the capacitance of the cancellation capacitor $C_C$ may be $C_C=C_{Xo}/(3*M)$. The value of the cancellation capacitor $C_C$ is inversely proportional to the value of M, and a larger value of M indicates a smaller capacitance value of the cancellation capacitor. Parameters of the cancellation capacitor $C_C$ and M are properly set according to the value of the baseline capacitance $C_{Xo}$ of the capacitor $C_X$, so that the cancellation capacitor better implements a charge cancellation on the capacitor to be detected. By properly setting parameters of the circuit, the circuit can reach the complete cancellation state when no touch occurs.

When M=20, $C_C=C_{Xo}/60$. The capacitance value of the cancellation capacitor $C_C$ may be greatly reduced, thereby reducing costs. In some embodiment of the present disclosure, M may be any value such as 5, 10, 20, or 50, and M may be set according to an actual requirement. The value of M is not limited in the present disclosure.

In the circuit control timing diagram of the present disclosure, the switch is controlled to switch between the first turned-on state and the second turned-on state back and forth for M times, so that cancellation efficiency of a cancellation circuit can be greatly improved, and requirements on a capacitance of a cancellation capacitor can be reduced, thereby better satisfying a requirement that a flexible screen needs to cancel a relatively large capacitor to be detected.

Figure 8:
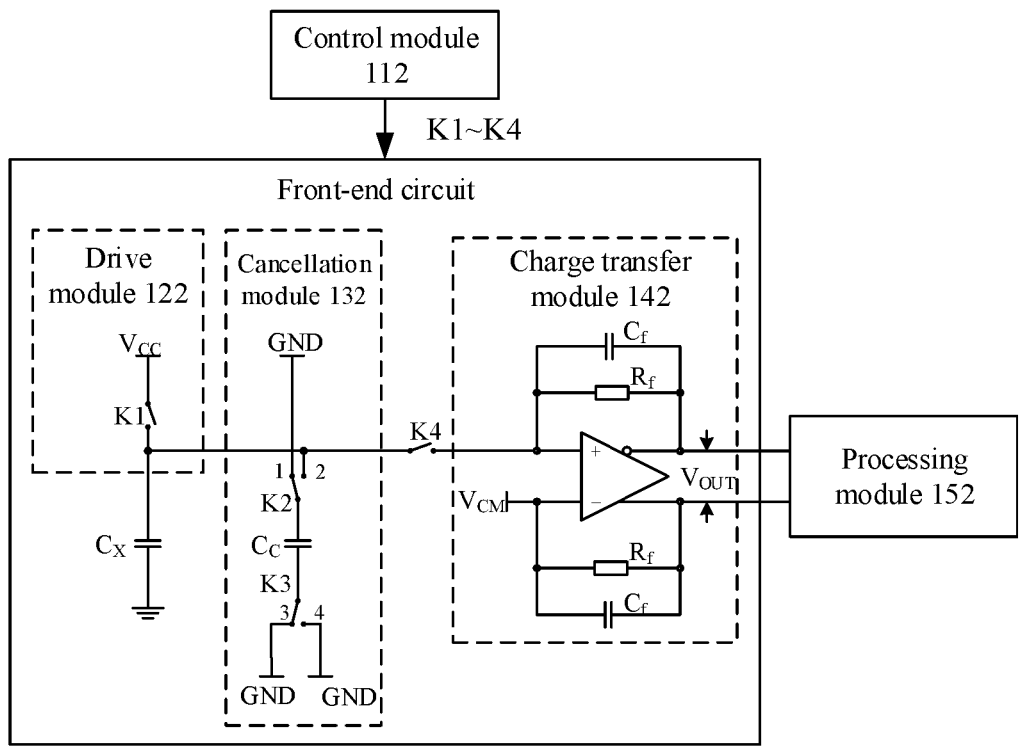
FIG. 8 is a schematic structural diagram of a capacitance detection circuit according to an alternative embodiment of the present disclosure.

FIG. 8 is a schematic structural diagram of a capacitance detection circuit according to an alternative embodiment of the present disclosure. As shown in FIG. 8, the capacitance detection circuit is the same as that in the foregoing embodiment and includes: a control module 112, a drive module 122, a cancellation module 132, a charge transfer module 142, and a processing module 152. A difference from the foregoing embodiment is that, the first end of the cancellation capacitor $C_C$ is electrically connected to a ninth voltage (GND) through the second switch unit K2, and the second end of the cancellation capacitor $C_C$ is electrically connected to a tenth voltage (GND) through the third switch unit K3; and when the second switch unit K2 and the third switch unit K3 are in the second turned-on state, the first end of the cancellation capacitor $C_C$ is electrically connected to the first end of the capacitor $C_X$, and the second end of the cancellation capacitor $C_C$ is electrically connected to a sixth voltage (GND), the sixth voltage being equal to the second voltage (GND) electrically connected to the second end of the capacitor $C_X$.

Figure 9:
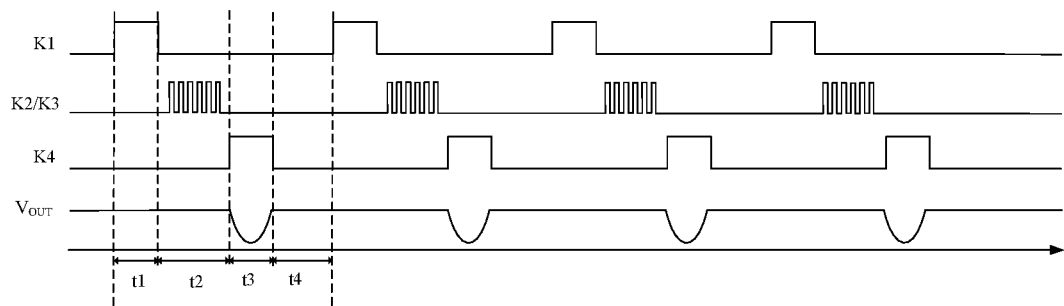
FIG. 9 is a timing diagram of the capacitance detection circuit in FIG. 8 according to an embodiment of the present disclosure.

FIG. 9 is a timing diagram of the capacitance detection circuit in FIG. 8 according to an embodiment of the present disclosure. As shown in FIG. 9, a detection cycle still includes periods of t1 to t4, and the detailed timing is as follows:

In the period t1, the first switch unit K1 is switched on (that is, K1 is in the turned-on state), the second switch unit K2 is connected to the contact 1 (that is, K2 is in the first turned-on state), the third switch unit K3 is connected to the contact 3 (that is, K3 is in the first turned-on state), the fourth switch unit K4 is switched off, and the capacitor $C_X$ is charged. At the end of the period t1, the voltage of the capacitor $C_X$ is $V_{CC}$.

In the period t2, the first switch unit K1 and the fourth switch unit K4 are switched off, and the second switch unit K2 and the third switch unit K3 simultaneously switch between the first turned-on state and the second turned-on state back and forth for M times. Each time the second switch unit K2 and the third switch unit K3 are switched from the first turned-on state to the second turned-on state, some of charges stored in $C_X$ are canceled by charges stored in $C_C$. After a steady state is achieved after repeating M times, according to the law of conservation of charge, $V_{CC}*C_X=V_X*C_X+M*V_X*C_C$ holds, and for the voltage of the capacitor $C_X$, $V_X=V_{CC}*C_X/(C_X+M*C_C)$ may be obtained.

In the period t3, the first switch unit K1 is switched off, the second switch unit K2 is connected to the contact 1 (that is, K2 is in the first turned-on state), the third switch unit K3 is connected to the contact 3 (that is, K3 is in the first turned-on state), the fourth switch unit K4 is switched on (that is, K4 is in the turned-on state), and $C_X$ is connected to the charge transfer module.

If $V_X>V_{CM}$, the capacitor $C_X$ and the cancellation capacitor $C_C$ both transfer a charge to the charge transfer module until the voltage of the capacitor $C_X$ reaches $V_{CM}$. In this process, the output voltage $V_{OUT}$ of the charge transfer module is a negative voltage.

If $V_X=V_{CM}$, the process of transferring the charge to the charge transfer module by the capacitor $C_X$ and the cancellation capacitor $C_C$ does not exist, and the output voltage $V_{OUT}$ of the charge transfer module is 0. In this case, the circuit reaches a complete cancellation state. By properly setting a parameter of the circuit, the circuit can reach the complete cancellation state when no touch occurs and can completely cancel a baseline capacitance of the capacitor $C_X$. When a touch occurs, a capacitance of the capacitor $C_X$ increases, and the output voltage $V_{OUT}$ is completely caused by the touch. Therefore, the detection sensitivity is the highest in this state.

If $V_X<V_{CM}$, the charge transfer module charges the capacitor $C_X$ and the cancellation capacitor $C_C$ through a feedback network (including $R_f$ and $C_f$) until the voltages of the capacitor $C_X$ and the cancellation capacitor $C_C$ reach $V_{CM}$. In this process, the output voltage $V_{OUT}$ of the charge transfer module is a positive voltage.

In the period t4, the first switch unit K1 is switched off, the second switch unit K2 and the third switch unit K3 are in the first turned-on state, the fourth switch unit K4 is switched off, the capacitor $C_X$ and the cancellation capacitor $C_C$ are reset, the charge transfer module is reset, and the output voltage $V_{OUT}$ becomes 0.

Specifically, this embodiment describes how to determine a value of a capacitance of the cancellation capacitor $C_C$. When no finger touches or approaches (that is, $\Delta C=0$), the value of the capacitance of the cancellation capacitor $C_C$ is adjusted, so that the voltage of the capacitor $C_X$ is $V_X=V_{CM}$, to obtain that the value of the capacitance of the cancellation capacitor $C_C$ is $C_C=C_X*(V_{CC}-V_{CM})/(M*V_{CM})$. In this case, the capacitor $C_X$ and the cancellation capacitor $C_C$ do not release charges to or absorb charges from the charge transfer module 142, or the cancellation capacitor $C_C$ completely cancels the capacitor $C_X$ and the output voltage of the charge transfer module 142 is Vout=0 V.

When a finger touches or approaches (that is, $\Delta C \neq 0$), if $V_X>V_{CM}$, the capacitor $C_X$ and the cancellation capacitor $C_C$ release charges to the feedback resistor $R_f$ and the feedback capacitor $C_f$ of the charge transfer module 142 until the voltage of the capacitor $C_X$ reaches $V_X=V_{CM}$. In this case, the charge transfer module 142 outputs a negative voltage $V_{out}$. If $V_X<V_{CM}$, the charge transfer module 142 releases charges to the capacitor $C_X$ and the cancellation capacitor $C_C$ through the feedback resistor $R_f$ and the feedback capacitor $C_f$ of the charge transfer module 142 until the voltage of the capacitor $C_X$ reaches $V_X=V_{CM}$. In this case, the charge transfer module 142 outputs a positive voltage $V_{out}$.

It can be seen from the foregoing descriptions that, at the end of the period t2, $V_{CC}*C_X=V_X*C_X+M*V_X*C_C$.

It can be seen from the foregoing descriptions that, at the end of the period t3, the voltages of the capacitor $C_X$ and the cancellation capacitor $C_C$ are definitely $V_{CM}$, and the quantity of transferred charges is as follows:

$$\Delta Q = V_X * C_X + M * V_X * C_C -$$
$$(V_{CM} * C_X + M * V_{CM} * C_C)$$
$$= V_{CC} * C_X - V_{CM} * C_X - M * V_{CM} * C_C$$

According to the timing process of t1 to t4, the quantity of transferred charges may be $\Delta Q=V_{CC}(C_{Xo}+\Delta C)-V_{CM}*C_{Xo}-M*V_{CM}*C_C$. When the complete cancellation state is reached, the quantity of transferred charges is $\Delta Q=V_{CC}*\Delta C$, the quantity of charges $\Delta Q$ is related only to a capacitance variation $\Delta C$ of the capacitor $C_X$, and is not related to the baseline capacitance $C_{Xo}$ of the capacitor $C_X$. The output voltage $V_{out}$ of the charge transfer module 142 directly reflects the capacitance variation $\Delta C$ of the capacitor $C_X$, an average value of the output voltage may be $V_{OUT}=2\Delta Q \cdot f \cdot R_f$. Here, f represents a detection frequency, a value of the detection frequency being a reciprocal of a detection cycle including t1 to t4.

In the complete cancellation state, $V_X=V_{CM}$, and the following relationship is obtained:

$$V_{CC}*C_{Xo}-V_X*C_{Xo}-M*V_{CM}*C_C=0$$

The capacitance of the cancellation capacitor $C_C$ may be $C_C=C_{Xo}*(V_{CC}-V_{CM})/(M*V_{CM})$. Particularly, when $V_{CC}=2V_{CM}$, the value of the capacitance of the cancellation capacitor $C_C$ may be $C_C=C_{Xo}/M$. The value of the cancellation capacitor $C_C$ is inversely proportional to the value of M, and a larger value of M indicates a smaller capacitance value of the cancellation capacitor. Parameters of the cancellation capacitor $C_C$ and M are properly set according to the value of the baseline capacitance $C_{Xo}$ of the capacitor $C_X$, so that the cancellation capacitor better implements a charge cancellation on the capacitor to be detected. By properly setting parameters of the circuit, the circuit can reach the complete cancellation state when no touch occurs.

When M=20, $C_C=C_{Xo}/20$. The capacitance value of the cancellation capacitor $C_C$ may be greatly reduced, thereby reducing costs. In some embodiment of the present disclosure, M may be any value such as 5, 10, 20, or 50, and M may be set according to an actual requirement. The value of M is not limited in the present disclosure.

Further, because $\Delta C$ is generally small, to reduce noise and improve the sensitivity, the first three stages, that is, t1, t2, and t3 stages, need to be repeated N times. In each detection stage, the processing module measures an output voltage Vout, then sums results at the N times according to weights, and outputs a summed voltage as a detection result. This method may be applied to any embodiment of the present disclosure.

Figure 10:
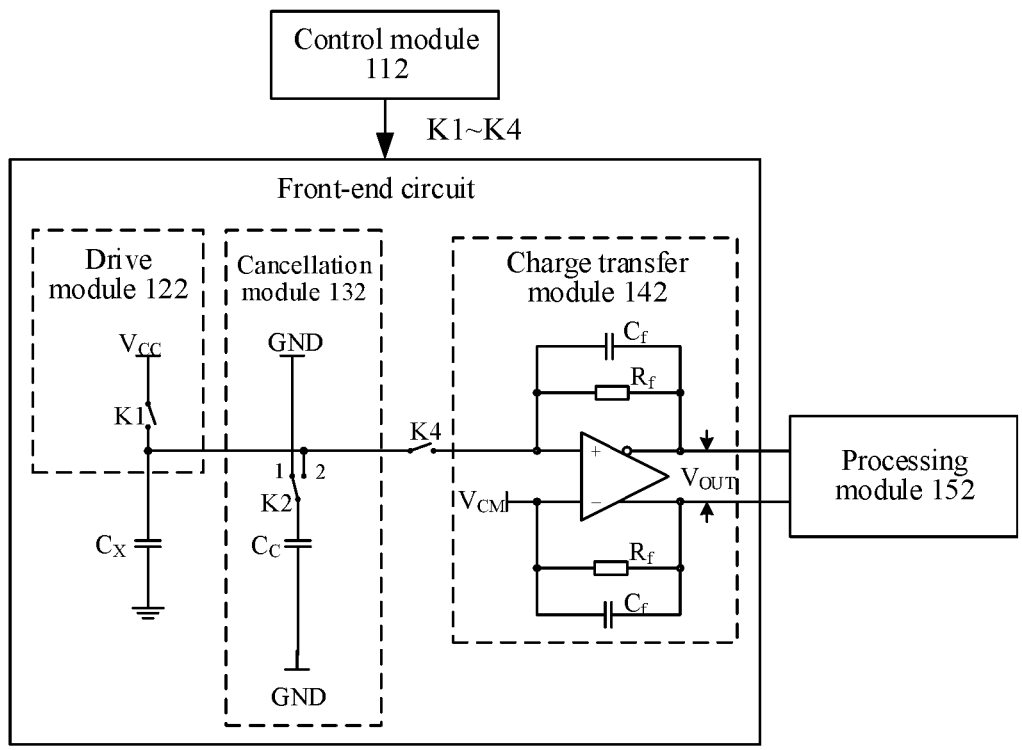
FIG. 10 is a schematic structural diagram of a capacitance detection circuit according to an additional embodiment of the present disclosure.

FIG. 10 is a schematic structural diagram of a capacitance detection circuit according to an additional embodiment of the present disclosure. As shown in FIG. 10, an additional capacitance detection circuit in this embodiment of the present disclosure is the same as that in the foregoing embodiment and includes: a control module 112, a drive module 122, a cancellation module 132, a charge transfer module 142, and a processing module 152. A difference from the foregoing embodiment is that, the first end of the cancellation capacitor $C_C$ is electrically connected to a ninth voltage (GND) through the second switch unit K2, and the second end of the cancellation capacitor $C_C$ is directly connected to a tenth voltage (GND); and when the second switch unit K2 is in the second turned-on state, the first end of the cancellation capacitor $C_C$ is electrically connected to the first end of the capacitor $C_X$, the tenth voltage being equal to the second voltage (GND) electrically connected to the second end of the capacitor $C_X$.

Figure 11:
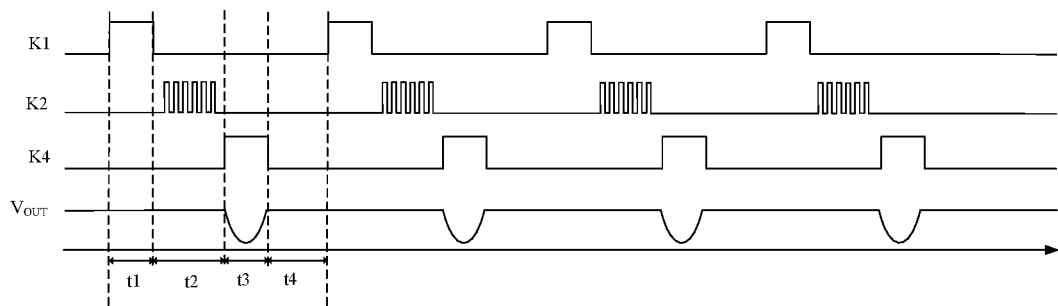
FIG. 11 is a timing diagram of the capacitance detection circuit in FIG. 10 according to an embodiment of the present disclosure.

FIG. 11 is a timing diagram of the capacitance detection circuit in FIG. 10 according to another embodiment of the present disclosure. Similar to the foregoing embodiment, a detection cycle still includes periods of t1 to t4. A difference from the foregoing embodiment is that the capacitance detection circuit in this embodiment does not have the third switch unit nor needs to control the third switch unit, and therefore, is simpler in circuit structure and circuit control.

Figure 12:
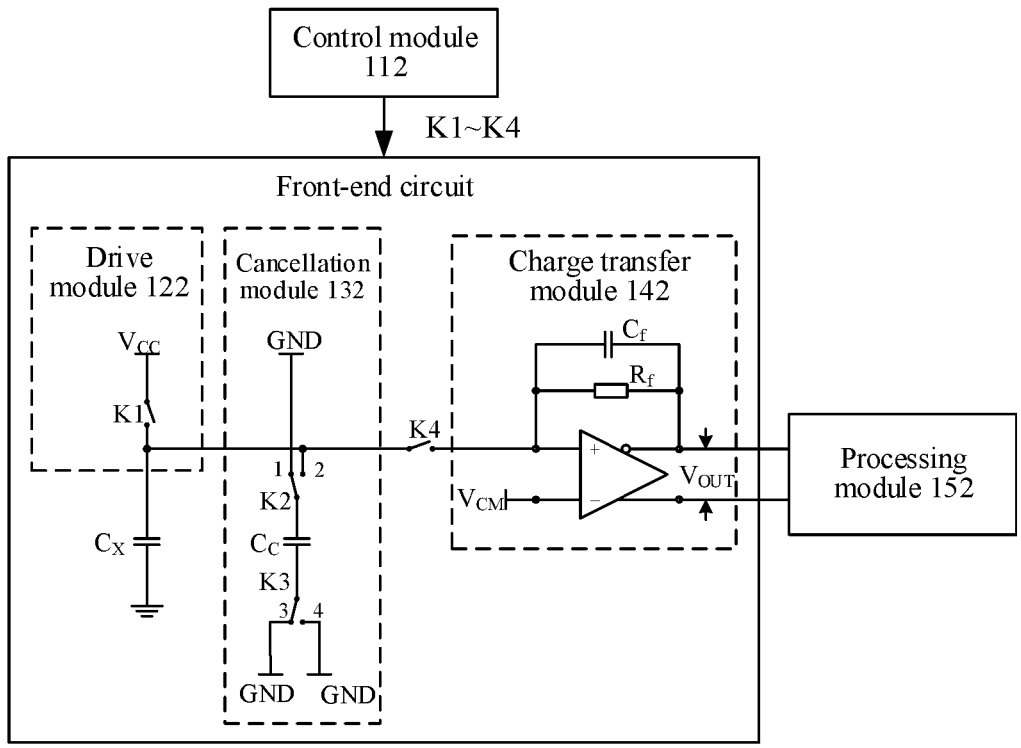
FIG. 12 is a schematic structural diagram of a capacitance detection circuit according to still another embodiment of the present disclosure.

FIG. 12 is a schematic structural diagram of a capacitance detection circuit according to still another embodiment of the present disclosure. As shown in FIG. 12, the capacitance detection circuit is the same as that in the foregoing embodiment and includes: a control module 112, a drive module 122, a cancellation module 132, a charge transfer module 142, and a processing module 152. The first end of the cancellation capacitor $C_C$ is electrically connected to a ninth voltage (GND) through the second switch unit K2, and the second end of the cancellation capacitor $C_C$ is electrically connected to a tenth voltage (GND) through the third switch unit K3. When the second switch unit K2 and the third switch unit K3 are in the second turned-on state, the first end of the cancellation capacitor $C_C$ is electrically connected to the first end of the capacitor $C_X$, and the second end of the cancellation capacitor $C_C$ is electrically connected to a sixth voltage (GND), the sixth voltage being equal to the second voltage (GND) electrically connected to the second end of the capacitor $C_X$. Different from the foregoing embodiment, the charge transfer module 142 is provided with a feedback resistor $R_f$ and a feedback capacitor $C_f$ between the positive end and the output end or between the negative end and the output end, and FIG. 12 shows a feedback resistor $R_f$ and a feedback capacitor $C_f$ being disposed between the negative end and the output end as an example.

Figure 13:
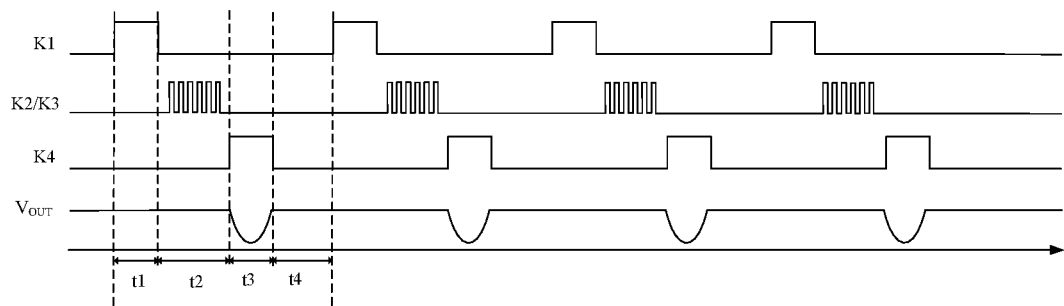
FIG. 13 is a timing diagram of the capacitance detection circuit in FIG. 12 according to an embodiment of the present disclosure.

FIG. 13 is a timing diagram of the capacitance detection circuit in FIG. 12 according to an embodiment of the present disclosure. A control manner is similar to that in the foregoing embodiment, and details are not described again in this embodiment of the present disclosure.

Certainly, a capacitance detection circuit structure in other embodiments of the present disclosure may use such a single-end charge transfer module. The single-end structure may save a set of feedback resistor and feedback capacitor, to achieve a simpler circuit.

According to the embodiments of the present disclosure, not only a circuit structure is simplified, but also cancellation efficiency of a cancellation circuit can be improved, and requirements on a capacitance of a cancellation capacitor can be lowered. Even a capacitance of a relatively small cancellation capacitance can cancel a baseline capacitance of a relatively large capacitance to be detected, costs are reduced, and noise of each cancellation voltage source is significantly reduced.

It should be understood that in an actual application, there may be an error in voltage parameters, capacitance parameters, or the like related to the drive module, the cancellation module, the capacitor to be detected, and the like. Therefore, the cancellation circuit possibly cannot completely cancel the baseline capacitance of the capacitor to be detected, that is, a contribution of the baseline capacitance to an output voltage of an amplifier may not be absolutely zero. Therefore, herein, that the cancellation circuit cancels the baseline capacitance may mean that the cancellation circuit cancels the baseline capacitance completely, or almost completely cancels the baseline capacitance (for example, a canceled part of the baseline capacitance reaches a threshold).

Figure 14:
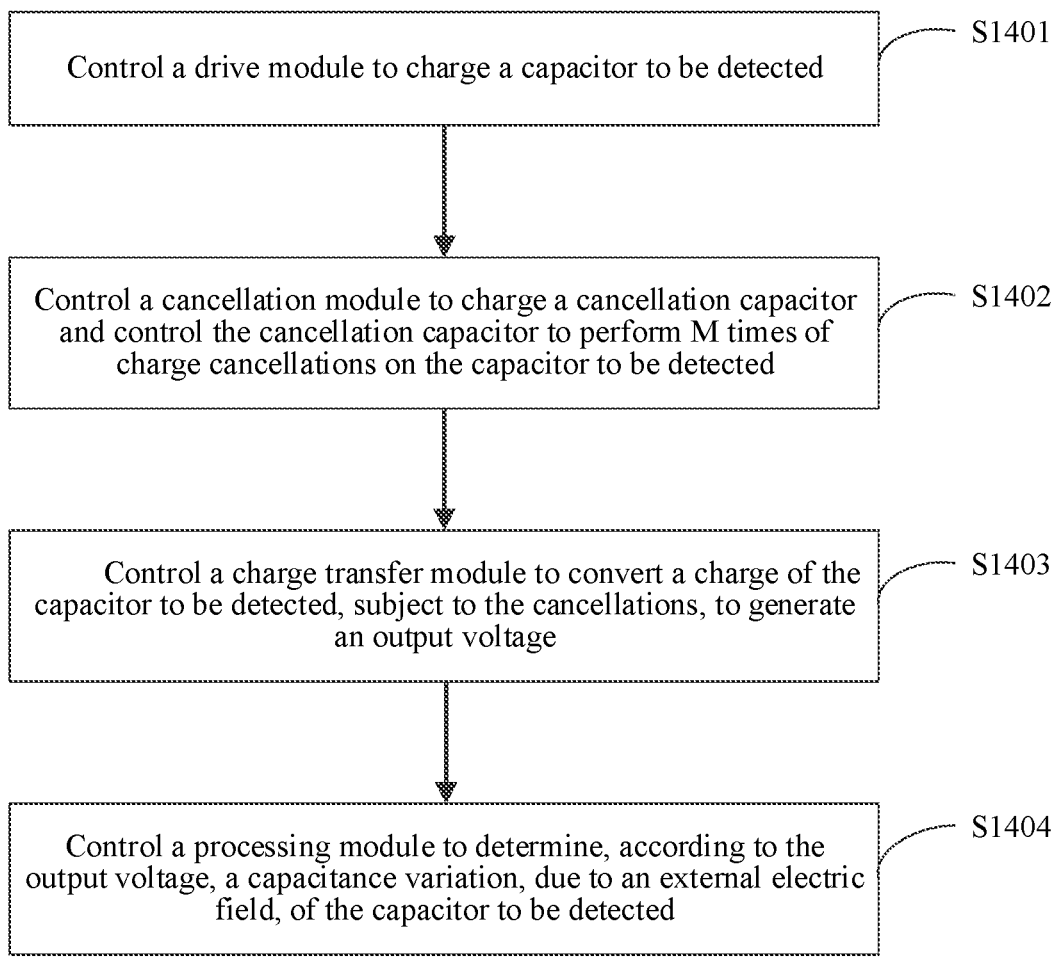
FIG. 14 is a flowchart of a method for cancelling a baseline capacitance of a capacitor to be detected according to an embodiment of the present disclosure.

The present disclosure further provides a to-be-detected capacitor cancellation method, applied to a capacitance detection circuit. As shown in FIG. 14, the method includes the following steps:

S1401. Control a drive module to charge a capacitor to be detected.

S1402. Control a cancellation module to charge a cancellation capacitor and control the cancellation capacitor to perform M times of charge cancellations on the capacitor to be detected.

S1403. Control a charge transfer module to convert a charge of the capacitor to be detected, subject to the charge cancellations, to generate an output voltage.

S1404. Control a processing module to determine, according to the output voltage, a capacitance variation, due to an external electric field, of the capacitor to be detected.

Optionally, the drive module includes a first switch unit, and the method includes: controlling the first switch unit to be in a turned-on state, so that the drive module charges the capacitor to be detected.

Optionally, the cancellation module includes a second switch unit and a third switch unit, and the method includes: controlling the second switch unit and the third switch unit to be in a first turned-on state to form a charging branch, so that the cancellation module charges the cancellation capacitor.

Optionally, the method includes: controlling the second switch unit and the third switch unit to switch between the first turned-on state and a second turned-on state back and forth for M times, so that the cancellation capacitor performs the M times of charge cancellations on the capacitor to be detected.

Optionally, the cancellation module includes a second switch unit, and the method includes: controlling the second switch unit to be in a first turned-on state to form a charging branch, so that the cancellation module charges the cancellation capacitor.

Optionally, the cancellation module includes the second switch unit, and the method includes: controlling the second switch unit to switch between the first turned-on state and a second turned-on state back and forth for M times, so that the cancellation capacitor performs the charge cancellations on the capacitor to be detected.

Optionally, the method includes: controlling a fourth switch unit to be in a turned-on state, so that the charge transfer module is electrically connected to the capacitor to be detected, to convert the charge of the capacitor to be detected, subject to the charge cancellation, to generate the output voltage.

Optionally, the method includes: controlling the fourth switch unit to be in an turned-off state, to reset the charge transfer module.

Optionally, the method includes: controlling the charge transfer module to perform N times of detections, to obtain N output voltages, and the processing module is configured to determine, according to the N output voltages, the capacitance variation, due to an external electric field, of the capacitor to be detected.

The embodiments of the present disclosure further provide an electronic device, including: a touch chip according to any one of the embodiments of the present disclosure.

In the foregoing embodiments, the cancellation capacitor $C_C$ is integrated into the touch chip, and therefore, a smaller cancellation capacitor indicates that the area and the costs of the touch chip are smaller. For such a consideration, in a specific application scenario, provided that a detected baseline capacitance of a capacitor to be detected may be reduced, a cancellation capacitor having a minimum capacitance is preferably selected to form the capacitance detection circuit.

It should be noted that, although that each switch unit implemented by a single switch is taken as an example for description in the foregoing embodiments, actually, a circuit combination structure may alternatively be used for implementation, and a combined component may be any electronic component with a switch-on/off function, provided that a charging branch and a cancellation branch may be formed, switching from the charging branch to the cancellation branch may be implemented, and the detection circuit may be caused to enter a charge transfer state.

In addition, when touch detection is implemented based on mutual capacitance detection, if a baseline capacitance of a mutual capacitance is so large that a change rate of the mutual capacitance may be affected, the idea in the foregoing embodiments of the present disclosure may also be applied.

The electronic device in the embodiments of the present disclosure may be in various forms, including but not limited to:

(1) Mobile communications device: Such a device is characterized by having a mobile communication function and mainly aiming at providing voice and data communication. Such a terminal includes: a smartphone (for example, an iPhone), a multimedia phone, a functional phone, a low-end phone, or the like.

(2) Ultra-mobile personal computer device: Such a device belongs to the scope of a personal computer, has computing and processing functions, and generally also has a mobile Internet access feature. Such a terminal includes: a PDA, a MID, a UMPC device, or the like, for example, an iPad.

(3) Portable entertainment device: Such a device may display and play multimedia content. Such a device includes: an audio and video player (for example, an iPod), a handheld game console, an ebook, an intelligent toy, and a portable in-vehicle navigation device.

(4) Server: It is a device providing a computing service, and includes a processor, a hard disk, a memory, a system bus, and the like. A structure of the server is similar to that of a general-purpose computer. However, because a highly reliable service needs to be provided, there are relatively high requirements on the processing capability, stability, reliability, security, scalability, manageability, and the like.

(5) Other electronic devices with a data exchange function.

So far, particular embodiments of the present disclosure have been described. Other embodiments fall within the scope of the appended claims. In some cases, the actions recorded in the claims may be performed in difference sequences and an expected result may still be achieved. In addition, the processes depicted in the accompanying drawings do not necessarily require specific sequences or consecutive sequences to achieve an expected result. In some implementations, multitasking and parallel processing may be beneficial.

It should also be noted that the terms "include", "comprise", or any other variants mean to cover the non-exclusive inclusion. Thereby, the process, method, product, or device which include a series of elements not only include those elements, but also include other elements which are not clearly listed, or include the inherent elements of the process, method, product, and device. Without further limitation, the element defined by a phrase "include one . . . " does not exclude other same elements in the process, method, product, or device which include the element.

In this specification, the embodiments are described in a progressive manner. Reference may be made to each other for a same or similar part of the embodiments. Each embodiment focuses on a difference from other embodiments. Especially, the system embodiment is basically similar to the method embodiments, and therefore is briefly described. For a relevant part, reference may be made to the description in the part of the method embodiments.

The foregoing descriptions are merely embodiments of the present disclosure and are not intended to limit the present disclosure. For a person skilled in the art, various modifications and variations can be made to the present disclosure. Any modification, equivalent replacement, or improvement made without departing from the spirit and principle of the present disclosure shall fall within the scope of the claims of the present disclosure.

What is claimed is:

1. A capacitance detection circuit, comprising: a control module, a charge transfer module, a processing module, a drive module, and a cancellation module; wherein the cancellation module includes a cancellation capacitor, a second switch unit, and a third switch unit; the second switch unit is connected to one end of the cancellation capacitor, and the third switch unit is connected to the other end of the cancellation capacitor;
wherein the control module is configured to control the drive module to charge a capacitor to be detected,
the control module is further configured to control the second switch unit and the third switch unit to be in a first turned-on state, so that the cancellation module charges the cancellation capacitor,
the control module is further configured to control the second switch unit and the third switch unit to be in a second turned-on state, so that the cancellation capacitor performs a charge cancellation on the capacitor to be detected,
the control module is further configured to control the second switch unit and the third switch unit to switch back and forth between the first turned-on state and the second turned-on state for M times, so that the cancellation capacitor performs charge cancellations on the capacitor to be detected M times,
the charge transfer module is configured to convert a charge of the capacitor to be detected, subject to the M times of charge cancellations, to generate an output voltage, and
the processing module is configured to determine, according to the output voltage, a capacitance variation of the capacitor to be detected.

2. The circuit according to claim 1, wherein the drive module comprises a first switch unit, and the control module is further configured to control the first switch unit to be in a turned-on state, so that the drive module charges the capacitor to be detected.

3. The circuit according to claim 2, wherein when the first switch unit is in the turned-on state, a first end of the capacitor to be detected is electrically connected to a first voltage, and a second end of the capacitor to be detected is electrically connected to a second voltage, the first voltage being greater than the second voltage.

4. The circuit according to claim 3, wherein the first voltage is provided by a positive voltage source, and the second voltage is a ground voltage.

5. The circuit according to claim 1, wherein when the second switch unit and the third switch unit are in the first turned-on state, a first end of the cancellation capacitor is electrically connected to a third voltage through the second switch unit, and a second end of the cancellation capacitor is electrically connected to a fourth voltage through the third switch unit, the fourth voltage being greater than the third voltage; and when the second switch unit and the third switch unit are in the second turned-on state, the first end of the cancellation capacitor is electrically connected to the first end of the capacitor to be detected, and the second end of the cancellation capacitor is electrically connected to a fifth voltage, the fifth voltage being less than the second voltage electrically connected to the second end of the capacitor to be detected.

6. The circuit according to claim 1, wherein when the second switch unit and the third switch unit are in the first turned-on state, a first end of the cancellation capacitor is electrically connected to a third voltage through the second switch unit, and a second end of the cancellation capacitor is electrically connected to a fourth voltage through the third switch unit, the fourth voltage being greater than the third voltage; and
when the second switch unit and the third switch unit are in the second turned-on state, the first end of the cancellation capacitor is electrically connected to the first end of the capacitor to be detected, and the second end of the cancellation capacitor is electrically connected to a sixth voltage, the sixth voltage being equal to the second voltage electrically connected to the second end of the capacitor to be detected.

7. The circuit according to claim 1, wherein the cancellation module comprises a cancellation capacitor, a second switch unit, and performing M times of charge cancellations on the capacitor to be detected comprises that:
controlling, by the control module, the second switch unit to be in a first turned-on state, so that the cancellation module charges the cancellation capacitor;
controlling, by the control module, the second switch unit to be in a second turned-on state, so that the cancellation capacitor performs a charge cancellation on the capacitor to be detected; and
controlling, by the control module, the second switch unit to switch between the first turned-on state and the second turned-on state back and forth for M times, so that the cancellation capacitor performs the M times of charge cancellations on the capacitor to be detected.

8. The circuit according to claim 7, wherein when the second switch unit is in the first turned-on state, a first end of the cancellation capacitor is electrically connected to a seventh voltage through the second switch unit, and a second end of the cancellation capacitor is electrically connected to an eighth voltage, the seventh voltage being less than the eighth voltage; and
when the second switch unit is in the second turned-on state, the first end of the cancellation capacitor is electrically connected to the first end of the capacitor to be detected, and the second end of the cancellation capacitor is electrically connected to the eighth voltage, the eighth voltage being equal to the second voltage electrically connected to the second end of the capacitor to be detected.

9. The circuit according to claim 7, wherein when the second switch unit is in the first turned-on state, a first end of the cancellation capacitor is electrically connected to a ninth voltage through the second switch unit, and a second end of the cancellation capacitor is electrically connected to a tenth voltage, the ninth voltage being equal to the tenth voltage; and when the second switch unit is in the second turned-on state, the first end of the cancellation capacitor is electrically connected to the first end of the capacitor to be detected, and the second end of the cancellation capacitor is electrically connected to an eighth voltage, the eighth voltage being equal to the second voltage electrically connected to the second end of the capacitor to be detected.

10. The circuit according to claim 1, wherein a capacitance value of the cancellation capacitor and a value of M are related to a value of the capacitor to be detected, so that the cancellation capacitor performs the M times of charge cancellations on the capacitor to be detected.

11. The circuit according to claim 2, wherein a capacitance value of the cancellation capacitor and a value of M are related to a value of the capacitor to be detected, so that the cancellation capacitor performs the M times of charge cancellations on the capacitor to be detected.

12. The circuit according to claim 3, wherein a capacitance value of the cancellation capacitor and a value of M are related to a value of the capacitor to be detected, so that the cancellation capacitor performs the M times of charge cancellations on the capacitor to be detected.

13. The circuit according to claim 10, wherein the capacitance value of the cancellation capacitor is inversely proportional to the value of M, and a larger value of M indicates a smaller capacitance value of the cancellation capacitor.

14. The circuit according to claim 1, further comprising a fourth switch unit, wherein the control module is further configured to control the fourth switch unit to be in a turned-on state, so that the charge transfer module is electrically connected to the capacitor to be detected, to convert the charge of the capacitor to be detected, subject to the M times of charge cancellations, to generate the output voltage.

15. The circuit according to claim 14, wherein the control module is further configured to control the fourth switch unit to be in a turned-off state, to reset the charge transfer module.

16. The circuit according to claim 1, wherein the control module is configured to control the charge transfer module to perform N times of detections, to obtain N output voltages, and the processing module is configured to determine, according to the N output voltages, the capacitance variation of the capacitor to be detected.

17. A touch chip, comprising a capacitance detection circuit, wherein the circuit comprised: a control module, a charge transfer module, a processing module, a drive module, and a cancellation module; wherein the cancellation module includes a cancellation capacitor, a second switch unit, and a third switch unit the second switch unit is connected to one end of the cancellation capacitor, and the third switch unit is connected to the other end of the cancellation capacitor;

wherein the control module is configured to control the drive module to charge a capacitor to be detected, the control module is further configured to control the second switch unit and the third switch unit to be in a first turned-on state, so that the cancellation module charges the cancellation capacitor, the control module is further configured to control the second switch unit and the third switch unit to be in a second turned-on state, so that the cancellation capacitor performs a charge cancellation on the capacitor to be detected, the control module is further configured to control the second switch unit and the third switch unit to switch back and forth between the first turned-on state and the second turned-on state for M times, so that the cancellation capacitor performs charge cancellations on the capacitor to be detected M times, the charge transfer module is configured to convert a charge of the capacitor to be detected, subject to the M times of charge cancellations, to generate an output voltage, and the processing module is configured to determine, according to the output voltage, a capacitance variation of the capacitor to be detected.

18. An electronic device, comprising a touch chip, the touch chip comprised a capacitance detection circuit, wherein the circuit comprised: a control module, a charge transfer module, a processing module, a drive module, and a cancellation module; wherein the cancellation module includes a cancellation capacitor, a second switch unit, and a third switch unit; the second switch unit is connected to one end of the cancellation capacitor, and the third switch unit is connected to the other end of the cancellation capacitor;

wherein the control module is configured to control the drive module to charge a capacitor to be detected, the control module is further configured to control the second switch unit and the third switch unit to be in a first turned-on state, so that the cancellation module charges the cancellation capacitor, the control module is further configured to control the second switch unit and the third switch unit to be in a second turned-on state, so that the cancellation capacitor performs a charge cancellation on the capacitor to be detected, the control module is further configured to control the second switch unit and the third switch unit to switch back and forth between the first turned-on state and the second turned-on state for M times, so that the cancellation capacitor performs charge cancellations on the capacitor to be detected M times, the charge transfer module is configured to convert a charge of the capacitor to be detected, subject to the M times of charge cancellations, to generate an output voltage, and the processing module is configured to determine, according to the output voltage, a capacitance variation of the capacitor to be detected.

* * * * *